(12) United States Patent
Derksen et al.

(10) Patent No.: US 11,187,738 B2
(45) Date of Patent: Nov. 30, 2021

(54) MEASUREMENT SYSTEM FOR DETECTION OF FAULTS ON WIRES OF A DEVICE OR EQUIPMENT

(71) Applicant: PHOENIX CONTACT GMBH & CO KG, Blomberg (DE)

(72) Inventors: Johann Derksen, Brakel (DE); Daniel Meyer Zu Heiligen, Bad Salzuflen (DE)

(73) Assignee: PHOENIX CONTACT GMBH & CO KG, Blomberg (DE)

( * ) Notice: Subject to any disclaimer, the term of this patent is extended or adjusted under 35 U.S.C. 154(b) by 0 days.

(21) Appl. No.: 16/742,397

(22) Filed: Jan. 14, 2020

(65) Prior Publication Data

US 2020/0225271 A1 Jul. 16, 2020

(30) Foreign Application Priority Data

Jan. 14, 2019 (DE) .......................... 102019200333.8

(51) Int. Cl.
*G01R 31/50* (2020.01)
*G01R 31/00* (2006.01)
*G01R 19/00* (2006.01)
(52) U.S. Cl.
CPC ....... *G01R 31/002* (2013.01); *G01R 19/0007* (2013.01); *G01R 31/50* (2020.01)
(58) Field of Classification Search
CPC ........ G01R 31/50–55; G01R 31/58–60; G01R 31/002; G01R 19/0007
See application file for complete search history.

(56) References Cited

U.S. PATENT DOCUMENTS

| 3,867,618 | A | * | 2/1975 | Oliver | G01R 31/50 714/745 |
| 4,032,841 | A | * | 6/1977 | Knippelmier | G01R 27/2605 324/678 |
| 5,132,629 | A | * | 7/1992 | Clinton | G01R 31/50 324/544 |
| 6,867,596 | B1 | * | 3/2005 | Mizuno | G01R 31/58 324/528 |
| 7,184,238 | B1 | * | 2/2007 | Ostwald | G11B 15/68 340/664 |
| 8,599,523 | B1 | * | 12/2013 | Ostrovsky | G08B 21/185 361/45 |
| 10,473,729 | B2 | * | 11/2019 | Zhu | G01R 31/50 |
| 2002/0047714 | A1 | * | 4/2002 | Murata | G01R 35/02 324/547 |

(Continued)

FOREIGN PATENT DOCUMENTS

DE 3742397 4/1989
DE 29514423 11/1995
(Continued)

*Primary Examiner* — Patrick Assouad
*Assistant Examiner* — Demetrius R Pretlow
(74) *Attorney, Agent, or Firm* — Sheridan Ross P.C.

(57) ABSTRACT

The invention relates to a measurement system for detection of conduction faults of a device or equipment, comprising an evaluation unit and at least one sensor unit, wherein the measurement system is furthermore adapted to determine, in regard to a fault, whether the fault is higher or lower in frequency with respect to a predetermined limit frequency, and the measurement system is furthermore adapted to provide data in regard to one fault or multiple faults.

11 Claims, 6 Drawing Sheets

(56) References Cited

U.S. PATENT DOCUMENTS

| | | | |
|---|---|---|---|
| 2002/0194547 A1* | 12/2002 | Christensen | G06F 11/3055 714/43 |
| 2004/0201373 A1* | 10/2004 | Kato | G01R 15/185 324/117 R |
| 2012/0274347 A1* | 11/2012 | Wang | G01R 1/06772 324/755.02 |
| 2013/0221973 A1* | 8/2013 | Whisenand | G01R 31/28 324/501 |
| 2016/0003887 A1* | 1/2016 | Nagase | H03K 17/687 327/546 |
| 2016/0187409 A1* | 6/2016 | Kolker | H02H 1/0015 361/42 |
| 2016/0187410 A1* | 6/2016 | Kolker | G01R 31/52 361/42 |
| 2017/0038423 A1* | 2/2017 | Ragaini | G01R 31/50 |
| 2017/0131339 A1* | 5/2017 | Inamoto | G01R 31/40 |
| 2018/0100879 A1* | 4/2018 | Jansen | G01R 15/183 |
| 2019/0154745 A1* | 5/2019 | Lu | G01R 31/2837 |
| 2019/0377021 A1* | 12/2019 | Bhalwankar | H02H 1/0007 |
| 2019/0386478 A1* | 12/2019 | Raisigel | G01R 19/0007 |
| 2020/0182921 A1* | 6/2020 | Jakupi | H01F 27/255 |

FOREIGN PATENT DOCUMENTS

| | | |
|---|---|---|
| DE | 4212751 | 3/2001 |
| DE | 202011110723 | 11/2015 |
| WO | WO 2010/096851 | 9/2010 |

\* cited by examiner

MEASUREMENT SYSTEM FOR DETECTION OF FAULTS ON WIRES OF A DEVICE OR EQUIPMENT

CROSS-REFERENCE TO RELATED APPLICATION

This application claims the benefit of German Patent Application No. DE 102019200333.8 filed 14 Jan. 2019, the entire contents of which are incorporated herein by reference in its entirety.

FIELD

The invention relates to a measurement system for detection of faults on wires of a device or equipment.

BACKGROUND

Electrical devices and equipment are increasingly vulnerable to voltage surges.

In a low-voltage network, both low-energy and high-energy faults occur.

High-energy faults are coupled into a low-voltage network on account of external influences, such as lightning events.

Due to the increasing use of semiconductor technologies and/or switching operations (e.g., by motors, contactors), low-energy faults are also occurring more frequently in low-frequency networks.

Due to the additional increasing miniaturization of electrical components, the vulnerability to faults of all types is increasing.

High-energy pulses occur more rarely than low-energy pulses.

In order to protect the vulnerable subassemblies against these faults, surge protection devices are used. These arrest the pulse current accompanying a voltage surge.

The low-energy faults (pulses) generally do not trigger a surge protection device, but may result in permanent damage in the equipment when the repetition rate is high.

The most diverse devices have been developed in the past in order to make it possible to detect faults and their influence on networks and surge arresters.

For example, it is known how to count high-energy surge events with a pulse counter.

On the other hand, lightning currents can also be measured. For this, devices are offered by the patent applicant, for example.

And various measurement probes are also found for laboratory use.

However, the above-indicated devices are not able to reliably detect low-energy faults.

In the past, tests on so-called electromagnetic compatibility have been proposed for the detection of low-energy faults during the certification of devices.

For example, a digital evaluation circuit is known from DE 42 12 751 C2, for example, which can measure the electromagnetic compatibility of digital subassemblies.

A compact EMC sensor is also known from DE 295 14 423 U1.

A network analysis device is known from DE 37 42 397 C1 for the identification, analysis, registration, recording and reporting of electromagnetic failures.

A measurement method for the detection of pulselike disturbances is known from DE 195 07 809 C2.

However, these devices are not suitable for the monitoring of ongoing operation and are generally not suitable for the detection of high-energy faults.

Furthermore, the aforementioned devices either require an intervention in the device and/or involve alterations in signals on the wires to the device by the measurement of the measuring device. This may result in a loss of information.

SUMMARY

Therefore, one problem which the invention proposes to solve is to provide a measurement system which can detect both high-energy and low-energy faults, without noticeably altering a possible useful signal.

The solution of the problem occurs according to the invention by the features of the independent claim. Advantageous embodiments of the invention are indicated in the dependent claims, the specification, and the figures.

BRIEF DESCRIPTION OF THE DRAWINGS

In the following, the invention shall be explained more closely with reference to the enclosed drawings and with the aid of preferred embodiments.

DETAILED DESCRIPTION

Figure 1:
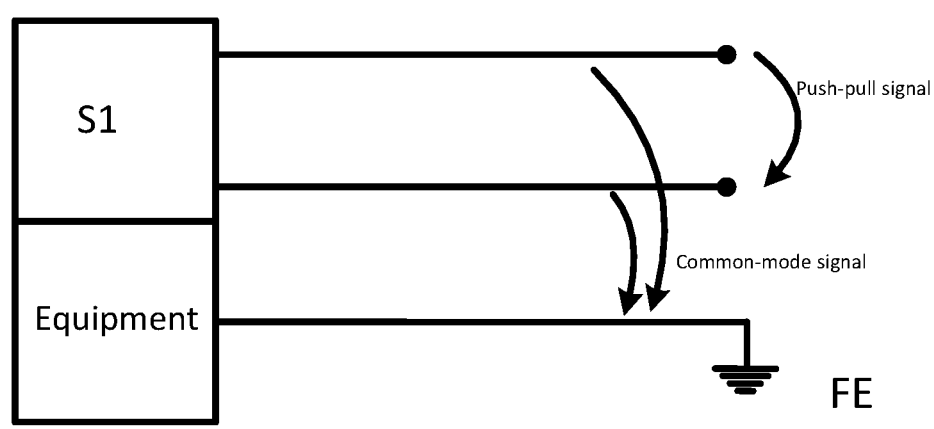
FIG. 1 shows a schematic arrangement of a sensor unit according to embodiments of the invention.

In the following, the invention shall be presented more closely with reference to the figures. It is to be noted that various aspects shall be described, each of which can be used separately or in combination. That is, any given aspect can be used with different embodiments of the invention, unless explicitly represented as being a pure alternative.

Furthermore, for sake of simplicity in the following, reference is always made in general to one item. Unless explicitly mentioned, however, the invention may also comprise many of the particular items. Accordingly, the use of the words "a" and "an" should be taken as meaning that at least one item is used in a single embodiment.

Insofar as methods are described in the following, the individual steps of a method may be arranged and/or combined in any desired sequence, unless otherwise indicated explicitly by the context. Furthermore, the methods may be combined with each other—unless otherwise explicitly indicated.

Indications of numerical values should generally not be understood as being exact values, but also contain a tolerance of +/−1% to +/−10%.

Insofar as standards, specifications, or the like are mentioned in this application, this will always refer at least to the standards, specifications, or the like applicable on the filing date. That is, if a standard or specification etc. is updated or replaced by a successor, the invention shall be applicable to that version.

Insofar as the term winding is used in the following, this shall also mean in particular a conductor loop or a plurality of conductor loops.

Insofar as reference is made in the following to a wire, this shall designate both an input/output wire as well as an internal electrical connection within a device or equipment item.

Various embodiments are represented in the figures.

The invention makes possible the detection of high-energy and low-energy pulses without mutual influence. In particular, the invention can provide a simultaneous detection of high-energy and low-energy pulses without mutual influence.

For this, the invention utilizes the fact that high-energy faults (e.g., pulses) occur in the frequency range of up to a few hundred kHz, while low-energy faults have frequencies of up to several hundred MHz.

Thanks to the invention, it is possible to detect (pulselike) faults having frequencies of 1 Hz up to several hundred MHz or into the GHz range.

In particular, the invention allows the seamless detection of a frequency range encompassing both typical low-energy and typical high-energy faults.

The invention enables a continuous monitoring in this process.

Such a continuous monitoring enables, for example, retroactive inferences based on the recorded history. The data may be helpful in troubleshooting in the event of device malfunctions.

For example, event data of the evaluation unit AE may be linked to other events.

If, for example, a fan controller in a housing section has frequent malfunctions, it can be inferred from the comparative data whether network disturbances (such as voltage surges) are the cause. If a fault source can be located, an appropriate remedy may be found.

Moreover, an increase in faults may occur if changes are made in a facility, and they can be diagnosed with the aid of data.

If, for example, a new motor is installed and faults occur increasingly as a result, the evaluation unit AE may conclude with the aid of a time stamp of the event data that the implementation of the motor is the cause.

The measurement system 1 for detection of faults on wires of a device or equipment comprises at least one evaluation unit AE and at least one sensor unit S1.

Figure 3:
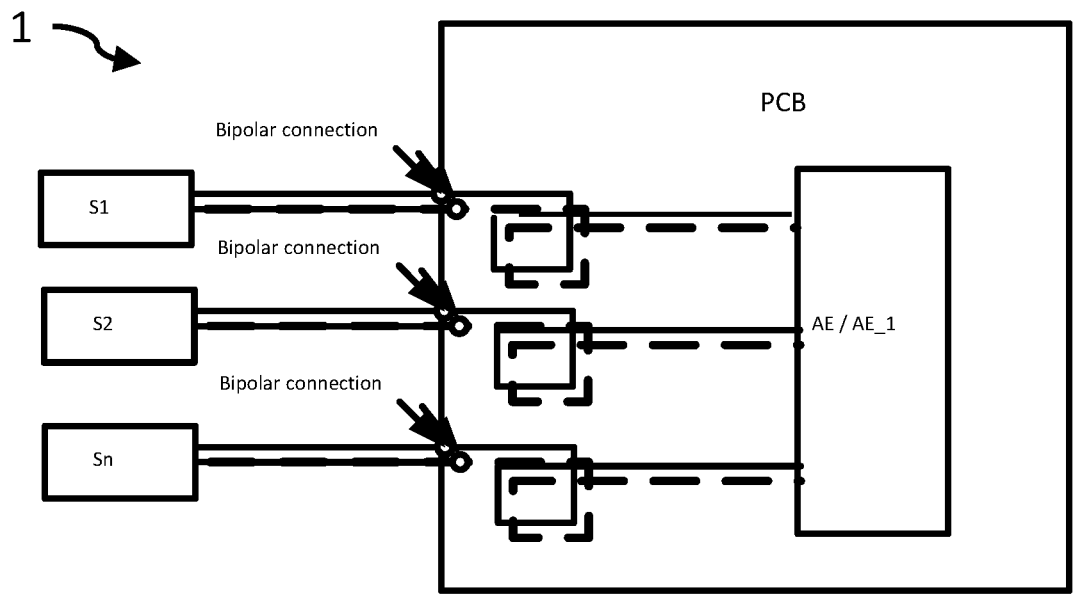
FIG. 3 shows a schematic arrangement of conducting paths of push-pull signals according to embodiments of the invention.
Figure 4:
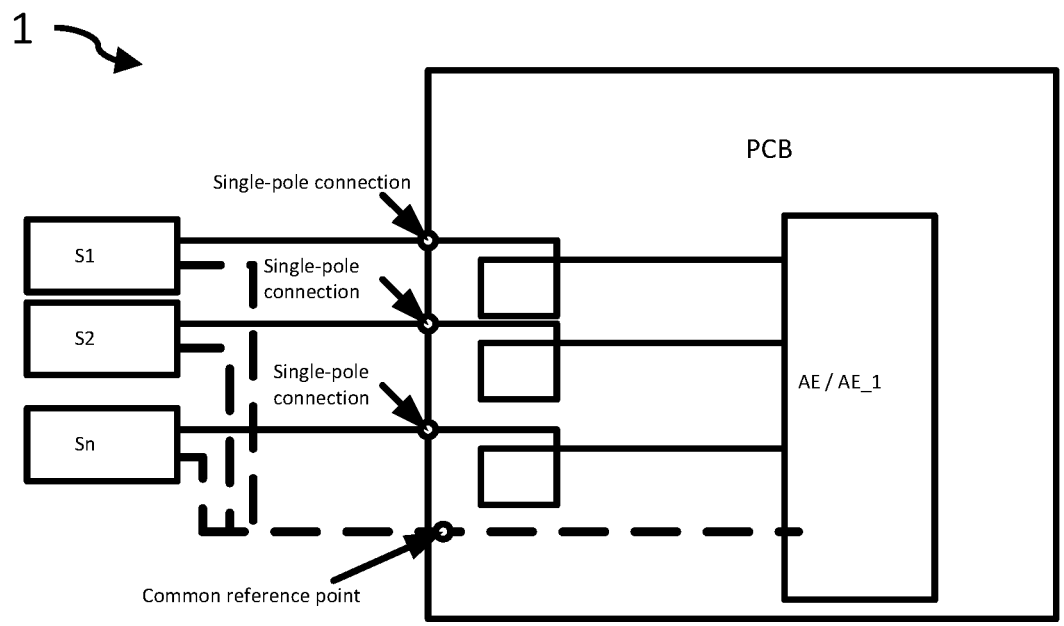
FIG. 4 shows a schematic arrangement of conducting paths of push-pull signals when using a common reference point according to embodiments of the invention.
Figure 5:
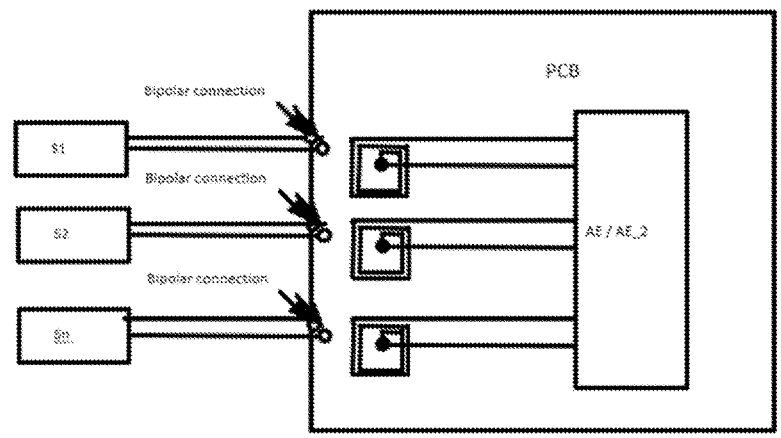
FIG. 5 shows a schematic arrangement of conducting paths of common-mode signals.

Without limiting generality, the measurement system may also comprise more than one sensor unit S1. For example, three sensor units S1, S2, . . . Sn are shown in FIGS. 3-5. The number can be limited, e.g., by the number of connection possibilities of such sensor units to the evaluation unit AE.

The sensor units S1, S2, Sn are in particular inductive sensors in which a useful signal is induced.

Inductive sensors have the advantage that no intervention in a circuit is needed. Instead, a stray field around a data and/or power supply wire can be used inductively as an information source, without altering the useful signal on the data and/or power supply wire. Furthermore, inductive sensors S1, S2, Sn provide a first insulation of the measurement system 1 relative to the wire being monitored.

Such sensors provide the evaluation unit AE with a differential signal especially for high-energy pulses. The differential signal (push-pull signal) is transported on two conductors. Thanks to the good insulation of the sensor unit S1 relative to the equipment or device, a (sufficiently high) capacity is provided in this respect, so that the sensor unit S1 can also provide the evaluation unit AE with a common-mode signal at the same time.

Furthermore, by providing a low-resistance connection of one of the two conductors of the sensor unit S1, S2, Sn to a grounding conductor of the equipment in the high-frequency range, this can be used to provide the common-mode signal to the evaluation unit AE. Such a low-resistance connection in the high-frequency range can be provided by a suitably dimensioned capacitor, so that the high-frequency signal in phase on the two conductors now becomes detectable. The low-resistance connection in the high-frequency range is denoted in FIG. 2 as a high-frequency bridge. Depending on the dimensioning, the capacitor may even constitute a short circuit for certain frequencies.

The measurement system 1 is furthermore adapted to determine, in regard to a fault, whether the fault is higher or lower in regard to a predetermined limit frequency, and furthermore the measurement system 1 is adapted to provide data in regard to one fault or multiple faults.

The provision of data can be made available to the evaluation unit AE by means of a local display DIS. Likewise, for example, it may also be provided that switching elements are provided at the evaluation unit AE in order to evaluate a history of past (stored) faults and corresponding event data.

Without limiting generality, it may be provided alternatively or additionally that the measurement system 1 furthermore comprises a communication interface I/O.

Through the communication interface, individual and/or multiple (stored) faults or their event data (energy, voltage, current, duration, frequency, time, etc.) may be provided for further evaluation. In particular, the communication interface I/O may comprise a standardized wireless or wireline interface. Providing in the sense of the patent application means both an active provision, so that event data is relayed directly or with a time delay or periodically to another device, and providing by fetching or calling up by another device.

In one embodiment of the invention, a transformer Ü with a primary side and a secondary side is arranged between the sensor unit S1 and the evaluation unit AE, wherein the sensor unit S1 is connectible to the primary side. A subunit of the evaluation unit AE may be connected to the secondary side.

In this process, the transformer Ü provides a galvanic separation. Furthermore, by suitable choice of the transmission ratio, the voltage level can be suitably adapted for the evaluation unit AE. Furthermore, a further decoupling of the useful signal is provided.

Such a transformer Ü can be designed especially economically on a circuit board PCB. For example, a first connected conductor of the sensor unit can be laid on the circuit board of the device in a conductor loop on a circuit board. This conductor loop represents the primary winding of a transformer Ü realized in the circuit board.

In a multipole connection, all the conductors belonging to a connection (of a piece of equipment or a device) are laid in parallel in the same way (same winding direction). They then collectively form the primary winding of the transformer Ü.

FIG. 3 furthermore shows an embodiment in which multiple sensor units each have a bipolar connection to a circuit board PCB. In this case, each sensor unit has its own reference point. The conductor loops of each such bipolar connection are arranged one on top of another in the same direction—as shall be shown further below. FIG. 4, on the other hand, shows an embodiment in which multiple sensor units each have a single-pole connection to a circuit board. In this case, multiple sensor units have a common reference point.

The secondary winding of the transformer Ü may be situated on the same or on at least one additional layer within the circuit board PCB. The number of turns of the secondary winding will depend on the desired induction voltage on the secondary side for further propagation.

The secondary winding of the transformer Ü may be connected to a conductor track with a reference potential (such as ground/GND). The other conductor track of the winding can be connected on the other side to an evaluation logic of the evaluation unit AE/AE_2. The evaluation unit AE/AE_2 is capable of detecting and evaluating the high-frequency fault pulses. The evaluation can be done, e.g., with a CMOS memory flip flop.

In one embodiment of the invention, the evaluation unit AE comprises an analog/digital converter. It is not necessary in this case to provide a multistage A/D converter. Instead, just a binary converter may be sufficient.

Figure 7:
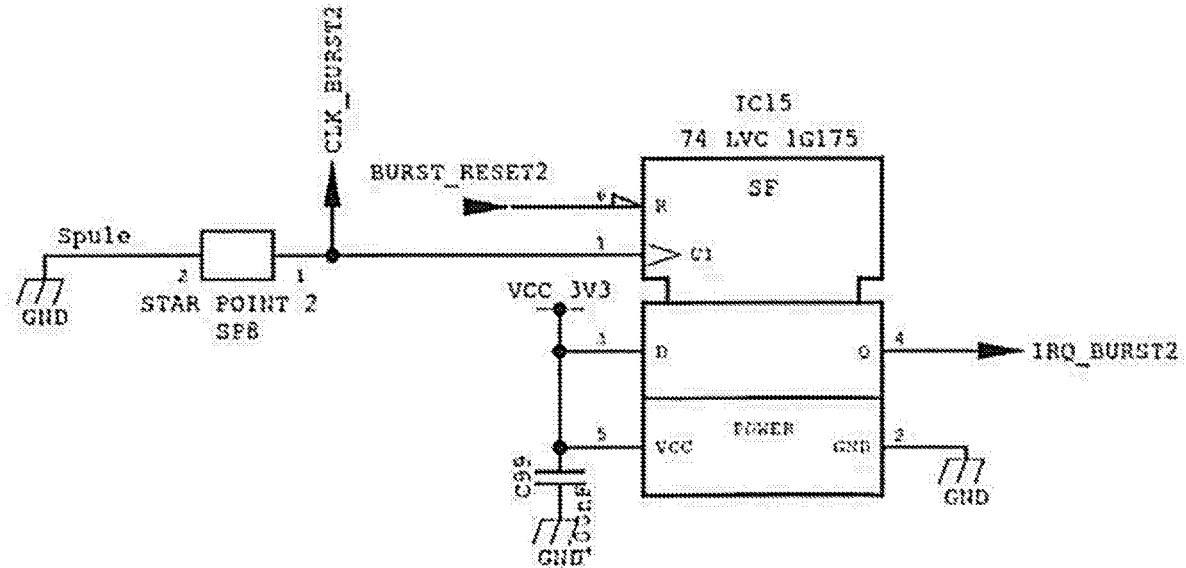
FIG. 7 shows an exemplary evaluation logic according to embodiments of the invention

An exemplary evaluation may occur, e.g., with a flip flop stage, as represented in FIG. 7. This carries out a 1-bit A/D conversion.

In one embodiment of the invention, the limit frequency is selected for high frequency/low frequency discrimination from a range of 250 kHz to 1 MHz.

Figure 8:
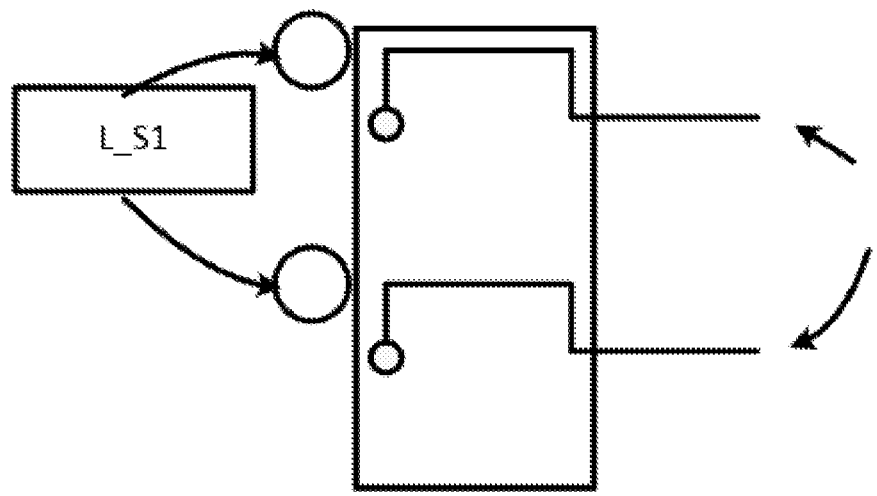
FIG. 8 shows conductor tracks in regard to a first conductor track layer in regard to push-pull signals according to embodiments of the invention.
Figure 9:
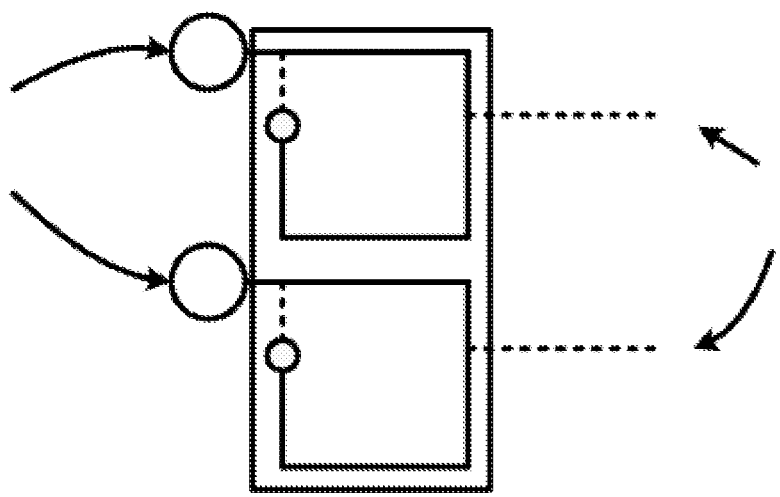
FIG. 9 shows conductor tracks in regard to a second conductor track layer in regard to push-pull signals according to embodiments of the invention.

For example, FIG. 8 shows the routes of conductor tracks of a first conductor layer. FIG. 9 likewise shows the routes of conductor tracks of a second conductor layer. The two layers together represent the conduction path of the push-pull signal. The push-pull signal is taken by wires L_S1 to the sensor unit 51. The push-pull signal is then taken by conductor tracks L_AE to the evaluation electronics AE/AE_1 for high-energy faults.

Figure 10:
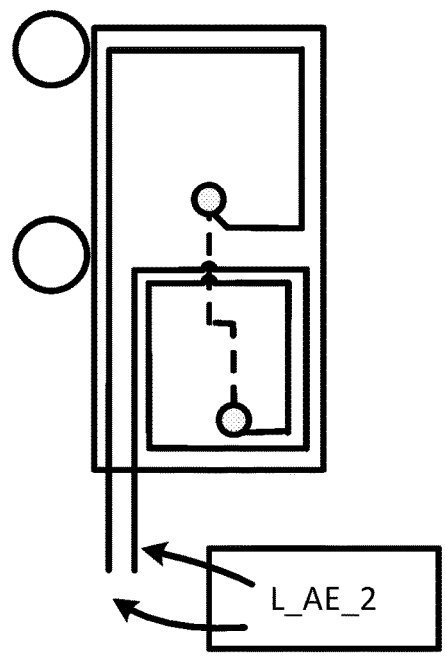
FIG. 10 shows conductor tracks in regard to a conductor track layer in regard to a common-mode signal according to embodiments of the invention.
Figure 11:
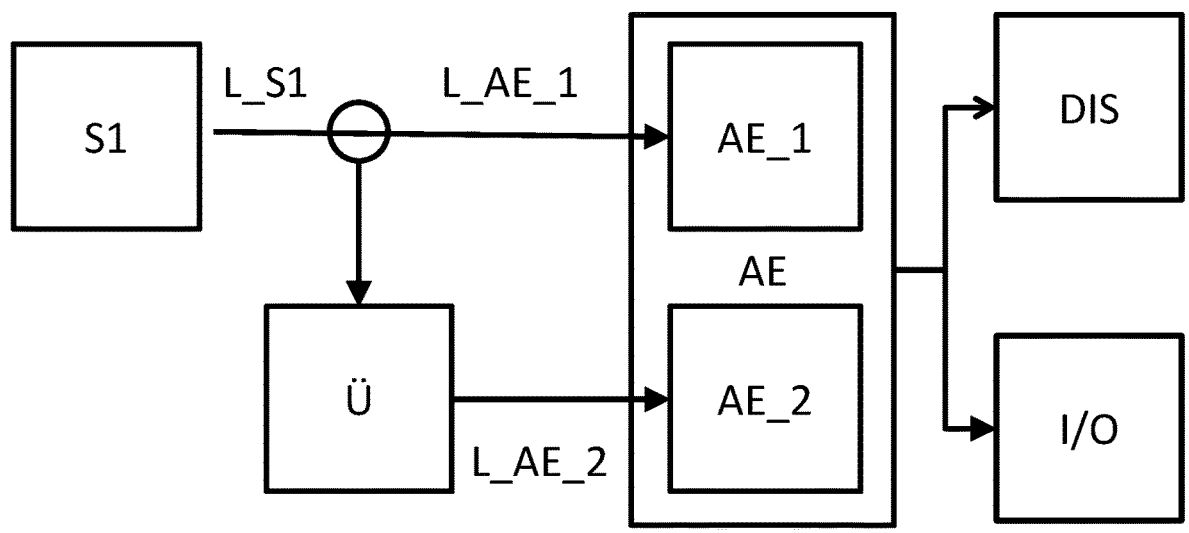
FIG. 11 shows a schematic arrangement of elements according to embodiments of the invention.

The common-mode signal for the detection of low-energy faults may be diverted, as shown in FIGS. 8 and 9, by means of a wire of the sensor element L_AE_1. This wire is inductively coupled, as shown in FIG. 10, to a conductor loop L_AE_2 having two conductor loops. It should be noted that FIG. 10 shows only the secondary side of the transformer Ü, while the primary side is found, e.g., in a representation of FIG. 8 or 9. Obviously, the number of conductor loops can be adapted accordingly.

Figure 6:
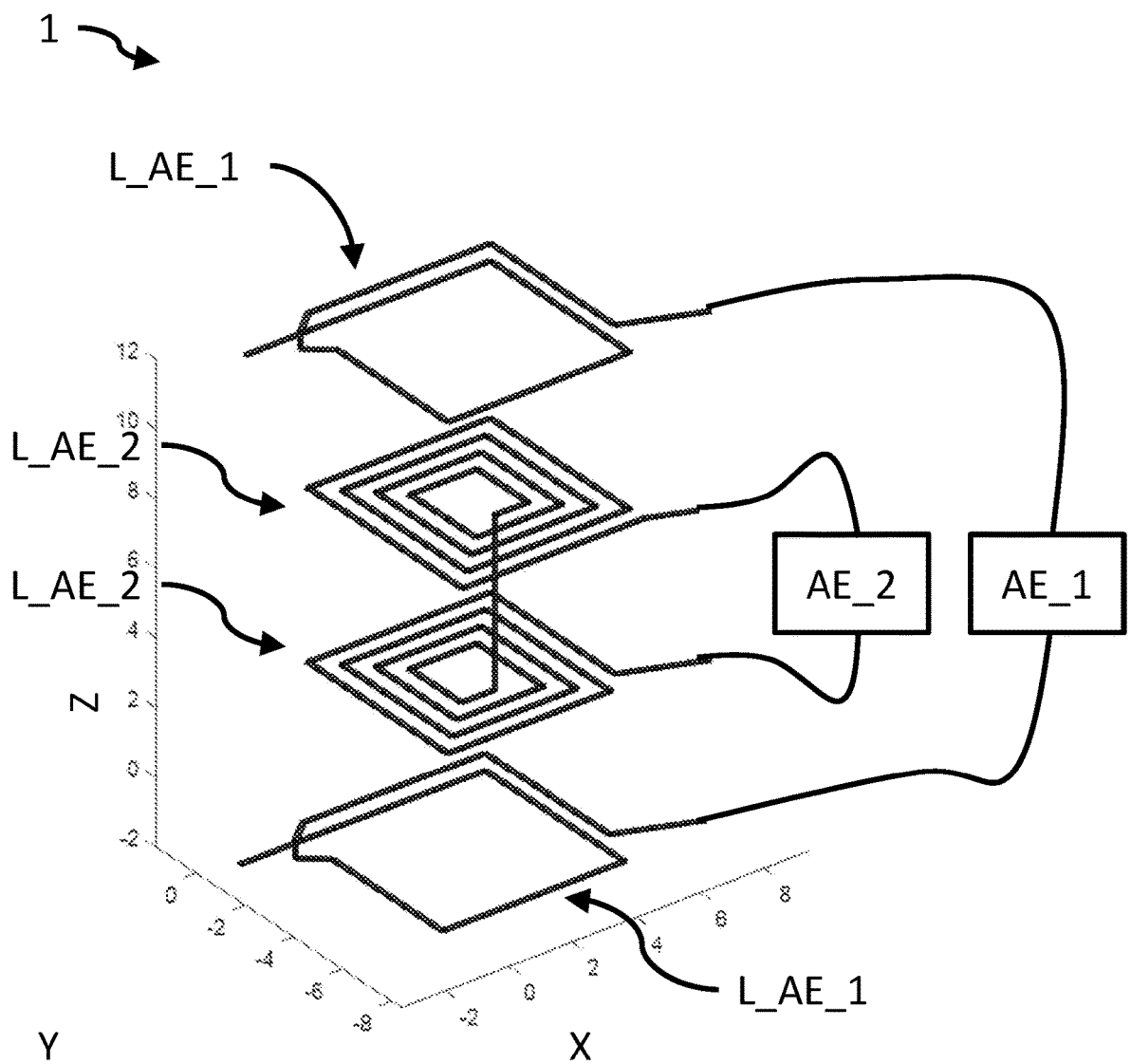
FIG. 6 shows a schematic arrangement of conductor tracks for providing push-pull signals and common-mode signals according to embodiments of the invention.

Although FIG. 10 shows an arrangement alongside each other in regard to the transformer Ü so formed, the invention is not limited to this. Instead, the conductor structures as represented in FIG. 6 may also be arranged in different conductor layers, such as those of a circuit board. The conductor tracks L_AE_1 and L_AE_2 then form the corresponding additional wires or transformer Ü.

Figure 2:
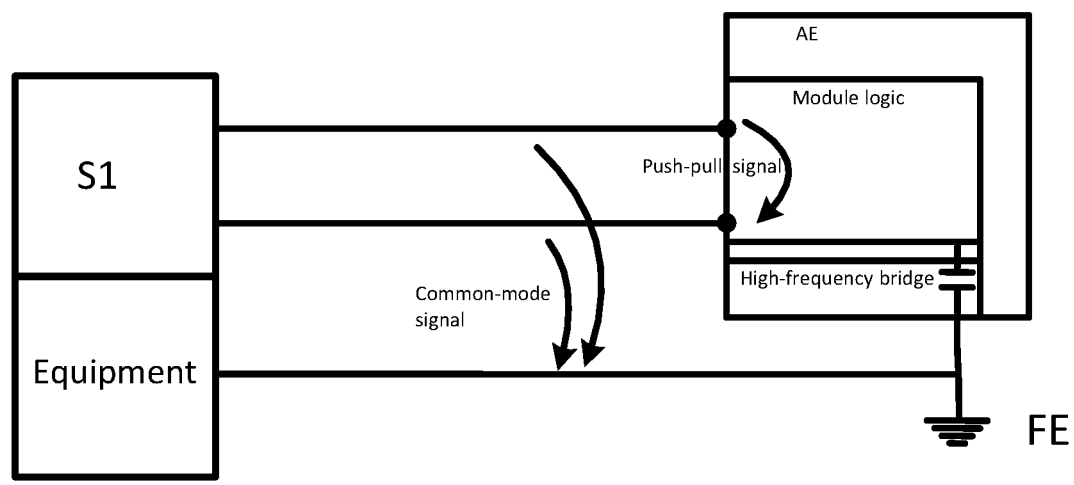
FIG. 2 shows a schematic arrangement of a sensor unit and evaluation device according to embodiments of the invention.

Thanks to this arrangement, a separation of the low-energy common-mode signal from the high-energy push-pull signal is provided, as [represented] in FIGS. 1 and 2 relative to FIG. 3. This makes it possible to detect and process the respective signals without being influenced by each other in different evaluation subunits AE_1 and AE_2.

In this process, the transformer Ü so formed provides a galvanic separation of the common-mode signal.

The input wires L_S1, which are connected to the sensor unit S1, may be laid in the same direction in one (or more) conductor loop(s).

In this way, the push-pull signal is practically unaffected.

The transformer Ü may be designed to be adjacent or preferably on at least one other layer of the circuit board, and as one or more conductor loop.

This produces a high-frequency (electromagnetic) coupling.

The coupling may be designed preferably without ferromagnetic materials, since such materials can influence linearity and/or result in a (partial) extinction of the actually desirable signals.

That is, the faults can be detected separately in embodiments. For example, low-frequency faults can be detected in a first evaluation subunit AE_1 and high-frequency faults in a second evaluation subunit AE_2. Furthermore, such an arrangement allows not only a structural separation, but also a simultaneous detection of low-frequency and high-frequency faults.

In another embodiment, as shown in FIG. 2, a connection to a common ground potential with the equipment/device provides e.g. a functional grounding.

In particular, the measurement system 1 is suitable for wires having a low-frequency voltage at least some of the time.

LIST OF REFERENCE NUMBERS

1 Measurement system
AE Evaluation unit
S1, S2, . . . Sn Sensor unit
I/O Communication interface
Ü Transformer
PCB Circuit board
FE Functional grounding
AE_1, AE_2 Evaluation subunit
L_AE Wire to evaluation unit
L_S1 Wire to sensor unit
L_AE_1 Wire to evaluation subunit
L_AE_2 Wire to evaluation subunit
DIS Display

The invention claimed is:
1. A measurement system for detection of faults on a wire of a device or a piece of equipment, the measurement system comprising:
at least one sensor that senses signals passing through the wire;
circuitry that detects a fault of the device or the piece of equipment based on output of the at least one sensor, wherein the circuitry is adapted to determine, in regard to the fault, whether the fault is higher or lower in frequency with respect to a predetermined limit frequency, and the circuitry is adapted to provide data associated with the fault; and a transformer with a primary side and a secondary side arranged between the at least one sensor and the circuitry to separate high-frequency faults from low-frequency faults, wherein the output of the at least one sensor includes a differential signal, and wherein the circuitry comprises an analog-to-digital converter.

2. The measurement system according to claim 1, further comprising a communication interface.

3. The measurement system according to claim 1, wherein the at least one sensor is connected to the primary side of the transformer.

4. The measurement system according to claim 1, wherein the at least one sensor comprises an inductive sensor.

5. The measurement system according to claim 1, wherein the transformer comprises conductor tracks on a circuit board.

6. The measurement system according to claim 1, wherein the at least one sensor includes a plurality of sensors.

7. The measurement system according to claim 1, wherein the limit frequency is selected from a range of 250 kHz to 1 MHz.

8. The measurement system according to claim 1, further comprising a connection to a functional grounding.

9. The measurement system according to claim 1, wherein the low-frequency faults are detected in a first part of the circuitry and the high-frequency faults are detected in a second part of the circuitry.

10. The measurement system according to claim 1, wherein the low-frequency faults are detected in a first part of the circuitry and the high-frequency faults are detected in a second part of the circuitry which is electrically separated from the first part of the circuitry.

11. The measurement system according to claim 1, wherein data associated with the fault includes data related to one or more of energy, voltage, current, duration, frequency, or time.

* * * * *